(12) United States Patent
Lewis, III et al.

(10) Patent No.: US 6,833,019 B1
(45) Date of Patent: *Dec. 21, 2004

(54) MICROWAVE ASSISTED CONTINUOUS SYNTHESIS OF NANOCRYSTALLINE POWDERS AND COATINGS USING THE POLYOL PROCESS

(75) Inventors: David Lewis, III, Alexandria, VA (US); Ralph W. Bruce, Arnold, MD (US); Arne W. Fliflet, Alexandria, VA (US); Steven H. Gold, New Carrollton, MD (US); Lynn K. Kurihara, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/355,066

(22) Filed: Jan. 31, 2003

(51) Int. Cl.$^7$ .................................................. B22F 9/24
(52) U.S. Cl. .............................. 75/345; 75/351; 75/362
(58) Field of Search ........................... 75/345, 351, 362

(56) References Cited

U.S. PATENT DOCUMENTS

| | | | |
|---|---|---|---|
| 5,652,192 A | | 7/1997 | Matson et al. |
| 5,759,230 A | | 6/1998 | Chow et al. |
| 6,232,264 B1 | * | 5/2001 | Lukehart et al. ............ 502/339 |
| 6,387,494 B1 | | 5/2002 | Yanagida et al. |
| 2004/0025635 A1 | * | 2/2004 | Kurihara et al. ............... 75/345 |

OTHER PUBLICATIONS

Komarneni et al., "Microwave–Polyol Process for Pt and Ag Nanoparticles", American Chemical Society 2002, vol. 18, pp. 5959–5962.

Tu et al., "Rapid Synthesis of Nanoscale Colloidal Metal Clusters By Microwave Irradiation", Journal of Materials Chemistry 2000, vol. 10, 2207–2211.
Kurihara et al., "Nanocrystalline Metallic Powders and Films Produced by The Polyol Method", NanoStructured Materials 1995, vol. 5, No. 6, pp. 607–613.
Grisaru et al., "Preparation of the Cd1–xZnx Se Alloys in the Nanophase Form Using Microwave Irradiation", Journal of Materials Chemistry 2002, vol. 12, pp. 339–344.
Kerner et al., "Sonochemical and Microwave–Assisted Preparations of Pbte and PbSe. a Comparative Study", American Chemical Society 2001, vol. 13, pp. 1413–1419.
Palchik et al., "Microwave–Assisted Polyol Method for the Preparation of CdSe Nanoballs", Journal of Materials Chemistry 2001, vol. 11, pp. 874–878.
Yu et al., "Synthesis of Nanoscale Platinum Colloids by Microwave Dielectric Heating", American Chemical Society 1999, vol. 15, pp. 6–9.
Grisaru et al., "Preparation of Cd1–xZnxSe Using Microwave Assisted Polyol Synthesis", American Chemical Society, vol. 40, pp. 4814–4815.
Kurihara et al., "Millimeter Wave Gyrotron Beam Processing of Nanocrystalline Metallic Powders and Coatings Using The Polyol Process", Non–Provisional Appl. No. 10/113,65, filed Mar. 29, 2002.

* cited by examiner

Primary Examiner—George Wyszomierski
(74) Attorney, Agent, or Firm—John J. Karasek; Joseph T. Grunkemeyer

(57) ABSTRACT

A method of forming a nanocrystalline metal, comprising the steps of: providing a reaction mixture comprising a metal precursor and an alcohol solvent; continuously flowing the reaction mixture through a reactor; applying microwave or millimeter-wave energy to the reaction mixture; wherein the microwave or millimeter-wave energy is localized to the vicinity of the reaction mixture; and heating the reaction mixture with the microwave or millimeter-wave energy so that the alcohol solvent reduces the metal precursor to a metal; wherein the heating occurs in the reactor.

25 Claims, 3 Drawing Sheets

Continuous Polyol Process Using Millimeter-Wave Applicator

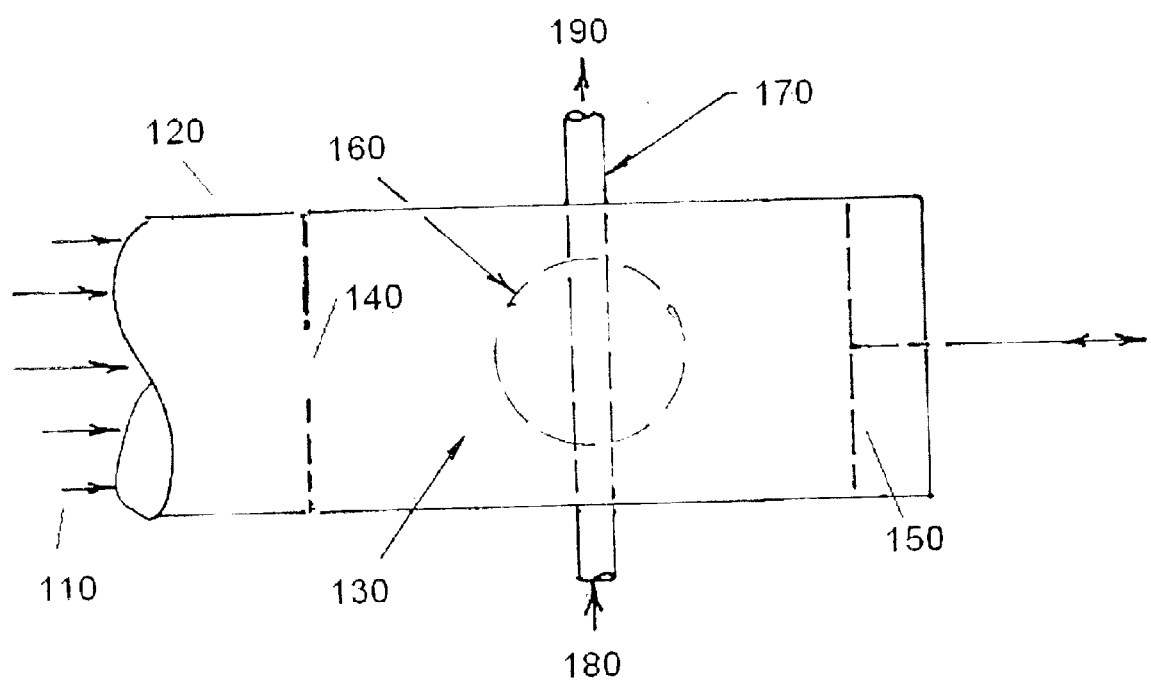
Fig 2. Continuous Polyol Process Using Standing Wave Applicator

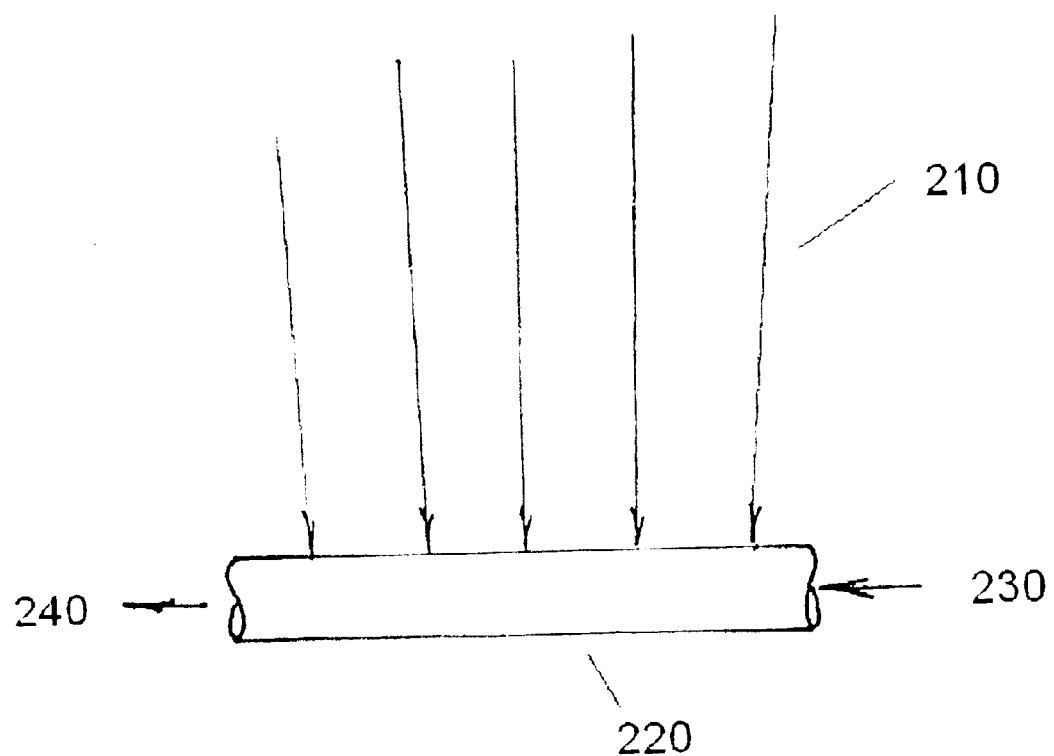
Fig. 3 Continuous Polyol Process Using Millimeter-Wave Applicator

MICROWAVE ASSISTED CONTINUOUS SYNTHESIS OF NANOCRYSTALLINE POWDERS AND COATINGS USING THE POLYOL PROCESS

BACKGROUND OF THE INVENTION

1. Field of the Invention

The present invention relates generally to the synthesis of metal powders and films, and more specifically, to the continuous synthesis of nanostructured metal powders and coatings using a microwave waveguide, cavity or beam system.

2. Description of the Related Art

Metallic powders have been prepared by physical vapor deposition, by mechanical blending and mixing, and by chemical routes. Vapor methods are not cost effective and make only small amounts of material. The mechanical blending route often introduces impurities into the final product. Fluidized beds have also been used to coat powders with metals, however, as in vapor methods, the initial equipment is expensive, and it is difficult to evenly coat powders and to handle powders of different sizes.

Metallic coatings have been prepared using electroplating and electroless plating. Electroless plating requires that the substrate be pretreated before plating and the substrate must also be an insulator. Using the polyol method, there does not need to be any chemical pretreatment of the surface and the substrates may be either conductive or insulators.

Nanostructured powders and films (with particle diameters of about 1–100 nm) have many potential electronic, magnetic, and structural applications such as catalysis, electromagnetic shielding, ferrofluids, magnetic recording, sensors, biomedical, electronics, and advanced-engineered materials.

Among the various preparative techniques, chemical routes offer the advantages of molecular or atomic level control and efficient scale-up for processing and production. Others in the art have prepared micron and submicron-size metallic powders of Co, Cu, Ni, Pb, and Ag using the polyol method. These particles were composed of single elements. Depending on the type of metallic precursors used in the reaction, additional reducing and nucleating agents were often used. The presence of the additional nucleating and reducing agents during the reaction may result in undesirable and trapped impurities, particularly non-metallic impurities.

These prior procedures have been unable to obtain nanostructured powders having a mean size of 1–25 nm diameter. These prior procedures have not been useful in producing nanostructured powders of metal composites or alloys or metal films.

U.S. patent application Ser. No. 10/113,651 to Kurihara et al. discloses the use of millimeter wave radiation to heat a polyol reaction mixture in a batch process. This process allows for the production of nanostructured metal powders and films via the polyol process.

Grisaru et al., "Preparation of $Cd_{1-x}Zn_xSe$ Using Microwave-Assisted Polyol Synthesis," Inorg. Chem., 40, 4814–4815 (2001), discloses the use of low power microwave radiation to make small hatches of metal nanoparticles. The yield of this process is less than single gram quantities per batch.

There remains a need for a process for making large quantities of nanostructured metal particles and films using the polyol process

SUMMARY OF THE INVENTION

The invention comprises a method of forming a nanocrystalline metal, comprising the steps of: providing a reaction mixture comprising a metal precursor and an alcohol solvent; continuously flowing the reaction mixture through a reactor; applying microwave or millimeter-wave energy to the reaction mixture; wherein the microwave or millimeter-wave energy is localized to the vicinity of the reaction mixture; and heating the reaction mixture with the microwave or millimeter-wave energy so that the alcohol solvent reduces the metal precursor to a metal; wherein the heating occurs in the reactor.

BRIEF DESCRIPTION OF THE DRAWINGS

FIG. 2 schematically illustrates an apparatus for practicing the method of the invention as a continuous process in a waveguide-based standing wave (resonant cavity) applicator; and FIG. 3 schematically illustrates an apparatus for practicing the method of the invention as a continuous process with an 83 GHz millimeter-wave beam applicator.

DESCRIPTION OF THE PREFERRED EMBODIMENTS

Figure 1:
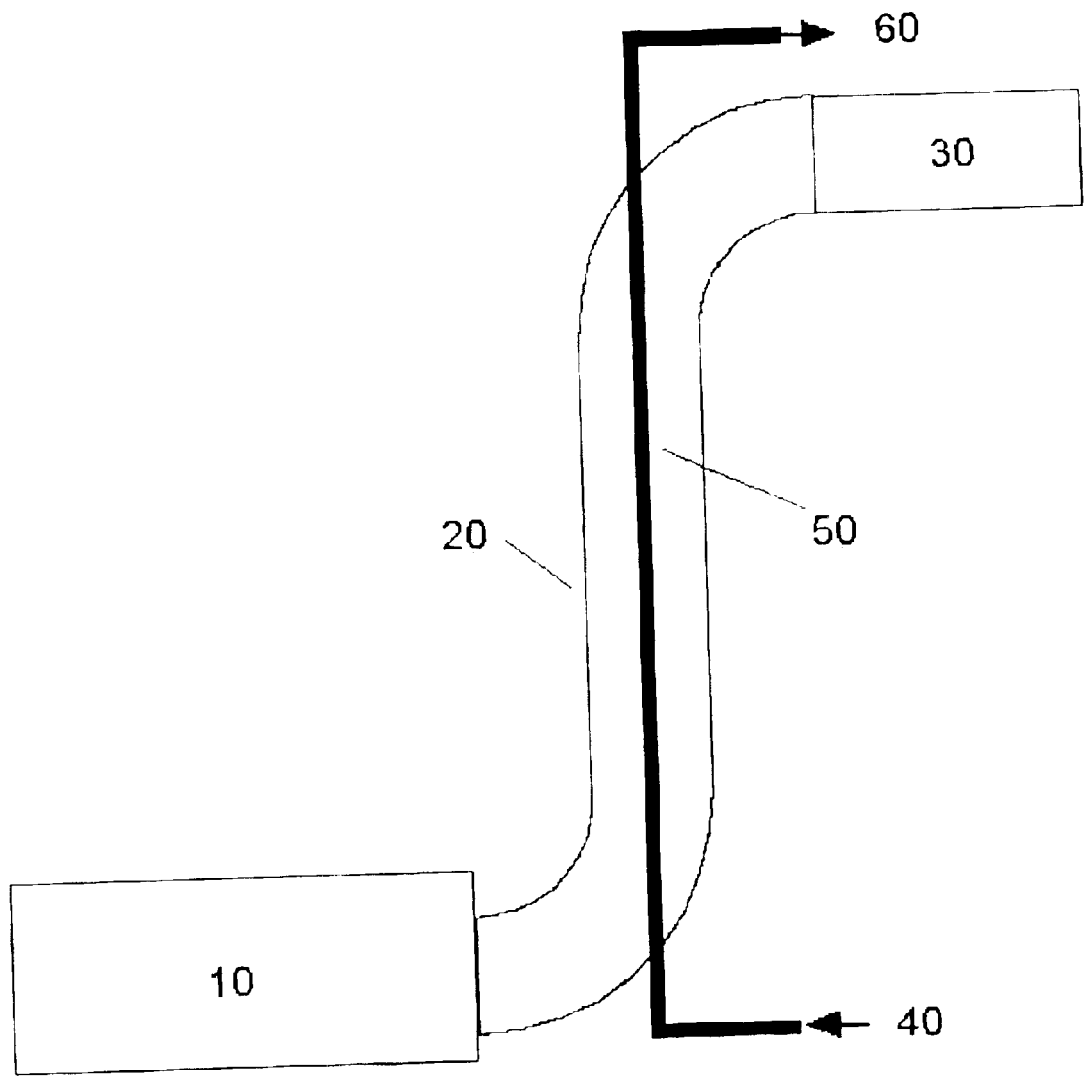
FIG. 1 schematically illustrates an apparatus for practicing the method of the invention as a continuous process in a traveling wave (waveguide) applicator.

In the first step of the invention, a reaction mixture comprising a metal precursor and an alcohol solvent, such as a glycol, is provided. More then one metal precursor and/or glycol solvent may be used. Any glycol solvent that is liquid and dissolves the metal precursor or precursors, or allows the metal precursor or precursors to react, at the reaction temperature may be used. For example, the polyols described by Figlarz et al., in U.S. Pat. No. 4,539,041, or described by Chow et al., in U.S. Pat. No. 5,759,230, the entireties of which are incorporated herein by reference, may be used. Specifically, Figlarz et al. recites the use of aliphatic glycols and the corresponding glycol polyesters, such as alkylene glycol having up to six carbon atoms in the main chain, ethylene glycol, a propylene glycol, a butanediol, a pentanediol, a hexanediol, and polyalkylene glycols derived from those alkylene glycols. Additional suitable glycol solvents for use in the present invention include, but are not limited to, diethylene glycol, triethylene glycol, tetraethylene glycol, propylene glycol, ethoxyethanol, butanediols, ethylene glycol monoethyl ether, diethylene glycol monoethyl ether, diethylene glycol diethyl ether, octanediol, and dodecanediol. Related solvents such as alcohols, e.g., ethanol, propanol, butanol may also be used if the appropriate reaction temperature can be reached without boiling of the solvent.

The reaction mixture may also comprise an additional organic solvent. Any organic solvent that is liquid or will become liquid at temperatures greater than 25° C., and dissolves the metal precursor so that it may react with the glycol solvent may be used. The glycol solvent may then be added to the metal precursor in the organic solvent any time after dissolution of the metal precursor.

Suitable metal precursors include, but are not limited to, metal acetates, chlorides, hydrates, nitrates, oxides, oxalates, carbonyls, hydroxides, acetylacetonates, oxalates, and carbonates. Preferred precursors to use for the formation of nanostructured powders and films including any specific metal are known in the art and will depend upon the metal selected. Suitable precursors may be substantially soluble in the reaction mixture.

The concentration of the precursor in the reaction mixture may influence crystallite size. When this influence occurs, smaller precursor concentration may provide smaller crystallites and particles. If the concentration of the precursor is too small, few, if any precipitates may form. Too high of a concentration of the precursor may result in crystallites that are larger than sub-micron size. Additionally, sufficient glycol solvent can be present to completely reduce essentially all metal precursors in the reaction mixture. Otherwise, the unreacted precursor may prevent the formation of a pure or essentially pure nanostructured metal material. Suitable ranges of concentration of the precursors are about 0.001–2.00 M, depending on the solubility of the precursor in the solvent. Typically, solutions near the saturation concentration are used, about 0.01–0.1M.

At the time of mixing, the glycol and/or any other organic solvent present may be either heated or unheated. Heating may facilitate the dissolution of the metal precursor, but may controlled to temperatures that do not initiate the reduction process.

The method described here is performed as a continuous process. This is done by flowing the reaction mixture through a reactor. The reactor should allow microwave energy to enter the reactor to heat the reaction mixture. The reactor may comprise a material that is transparent to microwave energy.

The process can be performed at ambient pressure, in which case the process temperature is limited to the normal boiling point of the solvent. The process can also be performed at a pressure above ambient, which has the advantage of elevating the boiling point of the solvent and permits more rapid reaction and processing.

Microwave energy is then applied to the reaction mixture. This heats the reaction mixture so that the glycol solvent reduces the metal precursor to a metal. As used herein, the term metal includes both metal and metal oxide. The metal may be produced in the form of metallic particles or a metallic coating. In the continuous process, this occurs while the reaction mixture is flowing through the reactor. In a typical batch microwave process, the microwave energy is applied to the reaction mixture by means such as a microwave oven. This generally does not allow the energy to be localized to the vicinity of the reaction. In the case of a millimeter-wave beam driven batch process, the energy can be localized to the vicinity of the reactor. More than a hundred-fold increase in metal powder output can be achieved in this way in the continuous process. The microwave source permits greatly accelerating the polyol process with the result of production of powders of smaller particle size and greater particle size uniformity. The continuous microwave process permits production of powders at much higher rates than in any of the batch microwave or millimeter wave processes.

The continuous microwave polyol process can be performed with three different types of microwave systems, all of which can effectively localize the microwave power in the reactor. The first, described below, is in a single pass, traveling wave applicator, where microwave energy propagates down the length of a waveguide, where the maximum field and power is concentrated at the center of the waveguide where the reaction tube is located. The second type of system is a standing wave system where the microwaves are introduced into a tuned cavity, which concentrates the microwave energy at the location of the reaction tube. The third is a beam system, where microwave energy, typically at shorter wavelengths, is focused onto the reactor through which the polyol solution flows. Suitable sources or microwave or millimeter wave energy include, but are not limited to, a magnetron and a gyrotron. Suitable wavelengths include, but are not limited to 2.45 GHz and 83 GHz.

FIG. 1 schematically illustrates an apparatus for practicing the method of the invention as a continuous process. The apparatus consists of a microwave magnetron 10 capable of producing 2.45 GHz microwave power, a waveguide 20, and a water load 30. The waveguide 20 directs the microwave energy along a vertical path and into the water load 30, which absorbs any microwave energy not coupled into the polyol solution flowing through the reactor. The water load does not take part in the reaction. Other means for removing excess microwave energy may also be used. The vertical portion of the waveguide 20 contains a reaction vessel 50, which is 10 mm diameter silica tube. A suitable tube 50 has a reaction zone of, but not limited to, 20 to 40 cm. This tube 50 is transparent to microwave energy. A pump 40 pumps the reaction mixture into the bottom of the tube, through the tube 50, and out of the outlet 60 at the top of the tube, where the mixture is collected. As the mixture passes through the tube 50 inside the waveguide 20, it is exposed, to the microwave energy, which produces the metallic particles. The pump speed is set to achieve the desired size and amount of metallic particles in the outlet stream 60. A suitable reaction time is about 10 seconds. The waveguide 20 pictured is a single-pass waveguide. The waveguide 20 may also lead into a resonant cavity around the reaction vessel to intensify the microwave power. A suitable range of microwave power for this apparatus is from about 1000 to about 3000 W.

FIG. 2 schematically illustrates an apparatus for practicing the method of the invention as a continuous process in a waveguide-based standing wave (resonant cavity) applicator. The microwave energy 110 at 2.45 GHz enters waveguide 120 containing a resonant cavity 130 bounded by an iris 140 and an adjustable short 150. The cavity 130 is 7.2 cm tall, which was determined by the frequency of the microwave energy 110. The circled area 160 shows the region of highest power. A 1 cm ID silica reaction tube 170 passes through this region 160. The reaction mixture enters at 180, passes through the reaction tube 170, and exits at 190.

FIG. 3 illustrates an apparatus for practicing the method of the invention as a continuous process with a millimeter-wave beam heating the solution in a reaction tube. A beam of millimeter-wave energy 210 reflects off a focusing mirror onto a reaction tube 220 through which the reaction mixture 230 is flowing. The beam is polarized and the polarization direction may be used to enhance the coupling to the reactor. A radiation shield may also be placed around the reaction tube to further concentrate the microwave power in the reactor. A suitable range of microwave power for this process, with a 1 cm diameter reaction tube is about 2000–4000 W, and the reduction process takes place in 1–2 seconds over a length of about 10 cm in the reaction tube. The effluent 240 contains the nanoparticles.

The efficacy of such rapid heating, for production of nanophase materials and the processing of such materials into useful components, has been demonstrated. Some of the advantages of using microwave energy as the heat source include rapid heating and cooling, volumetric heating, elimination of thermal inertia effects, and spatial control of heating. A microwave beam system at a wavelength of about 83 GHz, can be focused to a spot size as small as 0.5 cm if necessary, and, being a beam source, can also be steered, defocused, and shaped as necessary to direct microwave energy into a reactor. In a traveling wave system, with a reaction tube along the center of the waveguide, the microwave power is concentrated along the axis of the waveguide, with most of the power within the central 1–2 cm in a 2.456 GHz S-Band waveguide, and couples very well into the reaction mixture within the tube. In a standing wave system, using a resonant cavity, similar concentration of power is obtained, with most of the power concentrated within a few cubic centimeters in the center of an S-Band waveguide resonant cavity. The microwave energy provides a very effective heating source in the polyol process in production of nanophase-metal and metal alloy powders. This source allows for very short processing times and high heating rates, due to bulk heating of the solution. This results from direct coupling of the microwave energy to the polyol solution. 2.45 GHz microwave energy is particularly effective for heating ethylene glycol as this frequency is near that at which the peak absorption occurs in ethylene glycol. Rapid heating of solutions is possible because the heating rate is not limited by the requirement to transport heat to the reaction vessel, through the walls of the reaction vessel, and through the interior of the solution.

The microwave source allows for very short processing times, high heating rates, the ability to selectively coat substrates, and the ability to work in a superheated liquid region. Direct coupling of the microwave energy to the solution elements results in high heating rates due to bulk heating. Bulk heating also permits superheating, since boiling is normally nucleated at asperities on surfaces of containers. The ability to focus a beam allows for the ability to selectively coat substrates, by driving the reduction reaction in the immediate vicinity of the substrate.

Other advantages of microwave heating to drive the polyol process include faster reaction time, more uniform thermal heating, and thermal history. These result in smaller particle sizes, if desired, from the shorter reaction times, and a more narrow distribution of particle size (from the more uniform temperature distribution and thermal history.

The reaction mixture is reacted at temperatures sufficiently high to dissolve, or allow the reaction of, the metal precursor or precursors and form precipitates of the desired metal. Usually, refluxing temperatures are used. The mixture can be reacted at about 85° C.–350° C., or at about 150° C.–220° C., in the case of ethylene glycol solutions. The preferred temperature depends on the reaction system used, i.e., the solvents and precursor salts.

The pH may influence the method of the present invention. For examples, changing the pH during the reaction may be used to alter the solubility of the reaction product in the reaction mixture. By altering the solubility of the smallest crystallites during the reaction, the average size of the crystallites obtained may be controlled. If a constant pH is desired throughout the reaction, the reaction mixture may be modified to include a buffer.

During the reaction, the reaction mixture may, but need riot, be stirred or otherwise agitated, for example by sonication. The effects of stirring during the reaction depend upon the metal to be formed, the energy added during stirring, and the form of the final product (i.e., powder or film). For example, stirring during the production of a magnetic material would most likely increase agglomeration (here, the use of a surfactant would-be beneficial), while stirring during the formation of a film would most likely not significantly affect the nanostructure of the film. Stirring during the formation of films, however, will probably influence the porosity of the formed films and thus may be useful in sensor fabrication. Stirring is most feasible with the beam system, where the presence of the stirring probe does not affect the process.

The continuous process is generally used to produce metal or metal oxide particles. The process can also produce a metal film coated on a substrate, by transporting the substrate through the solution in the continuous system, e.g., on a belt carrying substrates through a flowing precursor solution heated locally by a millimeter-wave beam. To produce a nanostructured film, the substrate upon which the film is to be provided is contacted with the reaction mixture during the reaction. Unlike electrochemical deposition methods, which require an electrically conductive substrate, the present invention can provide thin, adherent (as determined by the adhesive tape test) nanostructured films on any surface, including electrically insulating substrates. Also, unlike aqueous electroless plating methods, the process of the present invention can produce thin, adherent nanostructured metal films on surfaces that should not be processed in aqueous environments.

After the desired precipitates form, the reaction mixture may be cooled either naturally (e.g., air-cooling) or quenched (forced cooling). Because quenching provides greater control over the reaction time, it is preferred to air-cooling. For quenching to be useful in the deposition of a conductive metal film upon a substrate, however, the substrate and the film/substrate interface must be able to withstand rapid thermal changes. If the substrate and/or film/substrate interface cannot withstand these rapid thermal changes, then air-cooling should be used.

The method of the present invention may be used to form various metals and alloys or composites thereof. For example, nanostructured films or powders of transition metals such as Cu, Ni, Co, Fe, Mn, or alloys or composites containing these metals, may be made according to the present invention. Further examples include Cr, Zn, Ga, Ru, Rh, Pd, Ag, Cd, Sn, Sb, W, Re, Ir, Pt, Au, and Pb. Still further examples are alloys of any of the above, such as CoNi, AgNi, FeCu, FePt, FeNi, FeCo, CuCo, etc. Metal/ceramic composites and metal oxides, such as $CoAl_2O_3$ and $CoFe_2O_3$ are also possible. As explained above, the precursor form for the metal will depend upon the metal itself. Generally, the precursor may be any metal-containing compound that, under the reaction conditions is reduced to the elemental-metal and by-products that are soluble in the reaction mixture. In the present invention, typical reaction times, at processing temperatures, extend from about 1 to 20 seconds, and more often from about 2 to 10 seconds. The method can produce metal particles having a mean diameter of about 100 nm or less.

The method of the present invention can produce nano-structured powders and films in the absence of a nucleating agent or catalyst. The resulting nanostructured films can thus be free or essentially free of impurities that would deleteriously alter their properties. If desired, surfactants and/or dispersants may be added to the reaction mixture to avoid the agglomeration of nanoparticles. If a highly pure product is desired, these surfactants and dispersants should be essentially free of insoluble materials, or capable of being burnt out of the final product. Where a surfactant is used, the best choice of surfactant will depend upon the desired metal. Steric stabilization, using a nonionic surfactant (e.g., a high temperature polymeric surfactant), is preferred, since ionic surfactants may undesirably alter the pH of the reaction system during reduction of the metal precursor. If desired, however, a mixture of ionic and nonionic surfactants can be used. If desired, high boiling point organics or capping agents may be added to the reaction mixture to avoid agglomeration. Examples of capping agents include any of the carboxylic acids of triglycerides such as: oleic acid, linoleic acid, linolenic acid and other high molecular weight acids, stearic acid and caprioc acid, and other agents such as trialkylphosphines.

The method of the present invention may also be used to produce nanostructured composite metal films and powders. As defined herein, a composite metal film includes at least one metal component and at least one other component that is intentionally included in amounts that significantly enhance the desirable properties of the film or powder. The other component, which is also nanostructured, is usually, but not necessarily, a metal. Where the other component is a metal, the metal may be any metal, not just those metals that could be deposited as a pure film according to the method of the present invention. Throughout the present specification and claims, the term "complex substance" is defined as a composite or an alloy that includes at least two different components. Throughout the present specification and claims, the term "alloy" applies to intermetallic compounds and solid solutions of two or more metals. The term "composite" applies to phase-separated mixtures of a metal with at least one other component. Where the other component of the final product is a chemically stable ceramic, the present invention provides a nanostructured metal/ceramic composite. Generally, a metal/ceramic composite includes at least 50 volume percent metal, in the form of a single-phase material or an alloy. Throughout the present specification and claims, the term "composite" includes alloys, and metal/ceramic composites.

To produce the complex substances, a precursor(s) for the at least one metal component and precursors for the other component or components are atomically mixed in the reaction mixture before heating the mixture to the reaction or refluxing temperature. Otherwise, the process proceeds as described above in the case of powders and films, respectively.

In producing composite substances according to the present invention, the initial molar ratios of the components to each other may not be reflected in the final product. Additionally, the ability of precursors for the components to atomically mix in the reaction solution does not assure that the components will form a composite substance final product. For this reason, the correct starting ratios of the precursors of each component for any composite substance must be determined empirically. The relative reduction potentials of each component can provide some guidance in making this empirical determination.

The solvent in the process may be recyclable. The powder feedstock can be any size or shape. The process of the present invention can also allow for the following aspects: the deposition of magnetic materials; the preparation of colloidal metals; the deposition of single elements, alloys and multicomponent elements; bulk heating of the solution which results from direct coupling of the beam energy to the solution elements: the alloying of immiscible metals; and the control of coating thickness and very rapid heating and control of solution kinetics.

Having described the invention, the following example is given to illustrate a specific application of the invention. This example is not intended to limit the scope of the invention described in this application.

EXAMPLE

Continuous production of Cu nanoparticles—Cu nanoparticles were produced using the apparatus of FIG. 1. The reaction mixture was 0.025 M copper acetate in ethylene glycol. The microwave energy source was Cober Model S6F Industrial Microwave Generator magnetron producing 2.0 kW of 2.45 GHz microwave energy. The pump speed was set to 3 $cm^3$/s, which produced a residence time in the silica tube of 10 s. The temperature in the tube was maintained at 205–210° C.

Cu particles were present in the effluent from the tube. The particles were kept suspended in the solvent for subsequent particle size measurement. The average particle size was 50 nm, with a bimodal distribution with peaks at 10 and 100 nm, determined by light scattering. The continuous process was operated for 300 s, producing a total of 1.5 g cu powder.

What is claimed is:

1. A method of forming a nanocrystalline metal, comprising the steps of:
   providing a reaction mixture comprising a metal precursor and an alcohol solvent;
   continuously flowing the reaction mixture through a reactor;

applying microwave or millimeter-wave energy to the reaction mixture;
  wherein the microwave or millimeter-wave energy is localized to the vicinity of the reaction mixture; and
heating the reaction mixture with the microwave or millimeter-wave energy so that the alcohol solvent reduces the metal precursor to a metal;
  wherein the heating occurs in the reactor.

2. The method of claim 1, wherein the metal is in the form of particles.

3. The method of claim 2, wherein the particles have a mean diameter of about 100 nm or less.

4. The method of claim 2, comprising the following additional step:
  removing the metal particles from the reaction mixture.

5. The method of claim 4, wherein the removing step is performed by filtration, centrifugation, or magnetic separation.

6. The method of claim 1, wherein the metal is in the form of a coating on a substrate.

7. The method of claim 1, wherein the providing step and the heating step are performed in such a manner that the metal is essentially free of non-metallic impurities.

8. The method of claim 1, wherein the providing step and the heating step are performed in such a manner that the metal is essentially pure metal.

9. The method of claim 1, wherein the metal precursor is selected from the group consisting of chlorides, acetates, acetylacetonates, oxides, carbonyls, carbonates, hydrates, hydroxides, nitrates, oxalates, and mixtures thereof.

10. The method of claim 1, wherein the alcohol solvent is a glycol.

11. The method of claim 1, wherein the alcohol solvent is selected from the group consisting of ethylene glycol, propylene glycol, tetraethylene glycol, ethoxyethanol, diethylene glycol monoethyl ether, and mixtures thereof.

12. The method of claim 1, wherein the reaction mixture further comprises one or more substances that are incorporated into the metal to form a composite.

13. The method of claim 1, wherein the microwave or millimeter-wave energy has a frequency of about 2.45 GHz.

14. The method of claim 1, wherein the microwave or millimeter-wave energy has a frequency of about 83 GHz.

15. The method of claim 1, wherein the microwave or millimeter-wave energy is supplied from a magnetron.

16. The method of claim 1, wherein the microwave or millimeter-wave energy is supplied from a gyrotron.

17. The method of claim 1, wherein the microwave or millimeter-wave energy is delivered to the reaction mixture by a waveguide.

18. The method of claim 17, wherein the microwave or millimeter-wave energy has a power of from about 1000 to about 3000 W.

19. The method of claim 17, wherein the waveguide is a single-pass waveguide.

20. The method of claim 17, wherein the waveguide has a resonant cavity.

21. The method of claim 1, wherein the microwave or millimeter-wave energy is in the form of a microwave beam.

22. The method of claim 21, wherein the microwave beam has a power of from about 500 to about 5000 W.

23. The method of claim 21, wherein the microwave beam has an intensity of about to about 500 W/cm$^2$.

24. The method of claim 1, wherein the metal precursor has a concentration of from about 0.01 to about 0.3 M in the reaction mixture.

25. The method of claim 1, wherein the metal precursor is copper acetate and the alcohol solvent is ethylene glycol.

* * * * *